(12) United States Patent
Berman (10) Patent No.: US 10,866,858 B2
(45) Date of Patent: Dec. 15, 2020

(54) MEMORY SYSTEMS HAVING REDUCED MEMORY CHANNEL TRAFFIC AND METHODS FOR OPERATING THE SAME

(71) Applicant: SAMSUNG ELECTRONICS CO., LTD., Suwon-si (KR)

(72) Inventor: Amit Berman, Ramat Gan (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/385,574

(22) Filed: Apr. 16, 2019

(65) Prior Publication Data

US 2020/0334105 A1 Oct. 22, 2020

(51) Int. Cl.
*G11C 29/00* (2006.01)
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC .............................. G06F 11/1068; G11C 29/52
See application file for complete search history.

(56) References Cited

U.S. PATENT DOCUMENTS

| | | | | |
|---|---|---|---|---|
| 2013/0055047 A1* | 2/2013 | Sharon | ................ | G06F 11/1068 714/764 |
| 2016/0254059 A1* | 9/2016 | Ochi | ................ | G11C 8/14 365/185.22 |
| 2016/0321135 A1 | 11/2016 | Berman et al. | | |

* cited by examiner

*Primary Examiner* — Samir W Rizk
(74) *Attorney, Agent, or Firm* — F. Chau & Associates, LLC (57) ABSTRACT

A storage device includes a nonvolatile memory (NVM) device having a plurality of memory blocks and a control circuit configured to perform a read for copy-back operation in response to a receipt of a corresponding command. The control circuit performs the read for copy-back operation by reading page data from a source memory block of the plurality, generating a syndrome from the read page data, outputting the syndrome, receiving error location data in response to outputting the syndrome, correcting the read page data using the received error location data, and writing the corrected read page data to a target memory block among the plurality.

18 Claims, 10 Drawing Sheets

MEMORY SYSTEMS HAVING REDUCED MEMORY CHANNEL TRAFFIC AND METHODS FOR OPERATING THE SAME

BACKGROUND

1. Technical Field

Exemplary embodiments of the present inventive concept relate generally to memory devices, and more specifically to performing a copy-back operation in memory devices.

2. Discussion of Related Art

In solid state devices (SSDs), data is stored in units referred to as pages. A page unit is finite in size and can only be written to when empty. Consequently, to write to a page that already contains data, the page must first be erased. Each page belongs to a group of pages referred to as a memory block. While data is written in units of pages, data is erased in blocks.

Within an SSD, a SSD controller utilizes a Flash Translation Layer (FTL), which coordinates communication between a NAND flash and a host system. Utilizing the FTL, the SSD implements a logical to physical mapping scheme referred to as Logical Block Addressing (LBA). By utilizing the FTL and LBA, physical NAND writes need not correspond directly to the space requested by the host system. Accordingly, instead of erasing the memory block including the particular page requested by the host system, and overwriting a piece of old data in the particular page, the SSD writes the new data to a next available page, and then marks the old data as invalid. Unfortunately, this manner of storing data results in fragmented storage of valid data among the physical space in the SSD.

As an SSD is filled with data, fewer free memory blocks are readily available. To free memory space for storing additional data in advance, the SSD performs what is referred to as garbage collection. During a garbage collection operation, the SSD consolidates valid data, and erases memory blocks to reclaim free memory space in the SSD.

Garbage collection operations frequently include copy-back operations. A copy-back operation is a page data copy operation in which page data is copied from a source page to a target page. Conventional SSD configurations, however, result in a relatively large amount of bus traffic during garbage collection processes including copy-back operations.

SUMMARY

According to an exemplary embodiment of the inventive concept, a storage device is provided. The storage device includes a nonvolatile memory (NVM) device having a plurality of memory blocks and a control circuit configured to perform a read for copy-back operation in response to a receipt of a corresponding command. The control circuit performs the read for copy-back operation by reading page data from a source memory block of the plurality, generating a syndrome from the read page data, outputting the syndrome, receiving error location data in response to outputting the syndrome, correcting the read page data using the received error location data, and writing the corrected read page data to a target memory block among the plurality.

According to an exemplary embodiment of the inventive concept, a method of performing a read for copy-back is provided. The method includes: reading page data from a source memory block of a nonvolatile memory (NVM) device in response to a command; generating a syndrome from the read page data; outputting the syndrome; receiving error location data in response to outputting the syndrome; correcting the page data using the received error location data; and writing the corrected page data to a target memory block of the NVM device.

According to an exemplary embodiment of the inventive concept, a storage device is provided. The storage device includes a nonvolatile memory (NVM) device having a plurality of memory blocks and a memory controller configured to output a first command to the NVM device for performing a read for copy-back operation on a source memory block of the plurality. The memory controller is configured to receive a syndrome from the NVM device in response to outputting the command, perform an error correction coding on the syndrome to generate error location data, and output the error location data to the NVM device.

BRIEF DESCRIPTION OF THE DRAWINGS

The present inventive concept will become more apparent by describing in detail exemplary embodiments thereof with reference to the attached drawings, in which.

DETAILED DESCRIPTION

Hereinafter, exemplary embodiments of the inventive concept in conjunction with accompanying drawings will be described. Below, details, such as detailed configurations and structures, are provided to aid a reader in understanding embodiments of the inventive concept. Therefore, embodiments described herein may be variously changed or modified without departing from embodiments of the inventive concept.

It will be understood that when an element is referred to as being "connected" or "coupled" to another element, it can be directly connected or coupled to the other element or intervening elements may be present.

The terminology used herein is for the purpose of describing particular embodiments only and is not intended to be limiting of example embodiments. As used herein, the singular forms "a," "an" and "the" are intended to include the plural forms as well, unless the context clearly indicates otherwise.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., non-volatile memories, universal flash memories, universal flash memory controllers, non-volatile memories and memory controllers, storage systems, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), System-on-Chip (SoC), field programmable gate arrays (FPGAs) computers or the like.

Further, according to one or more example embodiments, hosts, storage devices, device controllers, interfaces (host and/or device), error correction coding (ECC) circuits and/or processors, compression processors, etc., may be (or include) hardware, firmware, hardware executing software or any combination thereof. Such hardware may include one or more CPUs, SOC devices, DSPs, ASICs, FPGAs, computers, or the like configured as special purpose machines to perform the functions described herein as well as any other well-known functions of these elements. In at least some cases, CPUs, SOCs, DSPs, ASICs and FPGAs may generally be referred to as processing circuits, processors and/or microprocessors.

Although a flow chart may describe operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium," may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, processor(s), processing circuit(s), or processing unit(s) may be programmed to perform the necessary tasks, thereby being transformed into special purpose processor(s) or computer(s).

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

As data is written to a non-volatile memory, (e.g., flash-based SSDs, flash memory, etc.), fewer free memory blocks are readily available for storing data received from a host. To free memory space for storing additional data in advance, the SSD performs what is referred to as garbage collection. During a garbage collection operation, the SSD consolidates valid data, and erases memory blocks to reclaim free memory space in the SSD.

Garbage collection operations frequently include copy-back operations. A copy-back operation is a page data copy operation in which page data is copied from a source page to a target page. However, conventional SSD configurations and garbage collection processes result in a relatively large amount of traffic on buses and memory channels.

One or more example embodiments provide methods, devices, and non-transitory computer-readable storage mediums that may reduce the amount of traffic on a memory channel during operations, such as a read for copy-back operation or a garbage collection operation.

Figure 1:
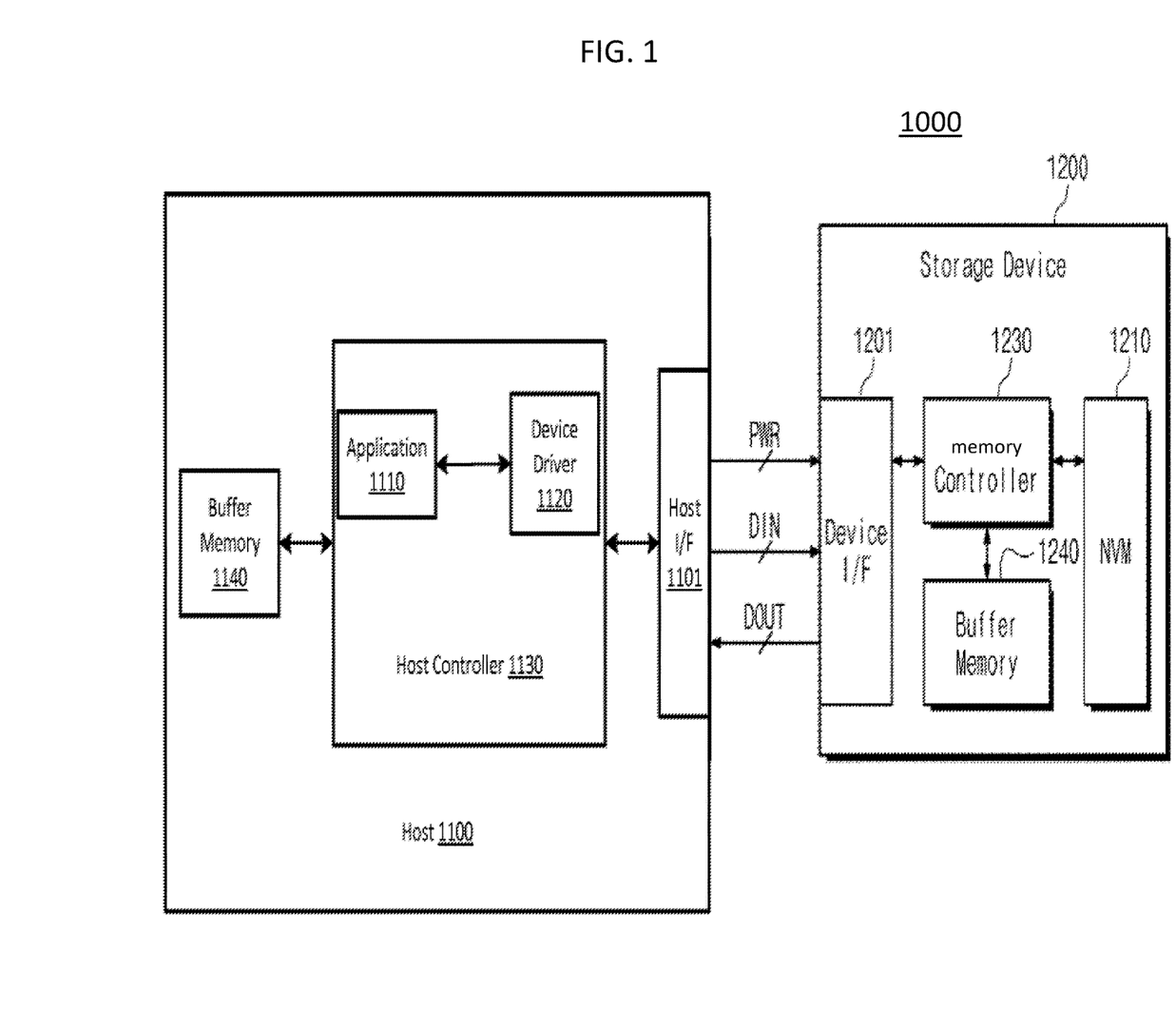
FIG. 1 illustrates a storage system according to an exemplary embodiment of the inventive concept.

FIG. 1 illustrates a storage system according to an exemplary embodiment of the inventive concept.

Referring to FIG. 1, the storage system 1000 includes a host 1100 and a storage device 1200. The host 1100 includes: a host interface 1101; a host controller 1130; and a buffer memory 1140. The storage device 1200 includes: a device interface 1201; a non-volatile memory (NVM) 1210; a memory controller (also referred to as a device controller) 1230; and a buffer memory 1240.

The storage device 1200 and the host 1100 are connected to one another through the interfaces 1101 and 1201. The host interface 1101 and the device interface 1201 may be standardized interfaces such as a Universal Flash Storage (UFS) interface, a serial advanced technology attachment (SATA) interface, a Small Computer Small Interface (SCSI), a serial attached SCSI (SAS), universal serial bus (USB) interface, etc. The host interface 1101 and the device interface 1201 are connected by data lines DIN and DOUT for exchanging data and/or signals, and by power lines PWR for providing power. In the example shown in FIG. 1, the host interface 1101 provides power to the device interface 1201 via the power line PWR.

The host controller 1130 receives data from, and sends commands (e.g., read and/or write) and/or data to, the storage device 1200 through the host interface 1101. The host controller 1130 includes an application 1110 and the device driver 1120. The application 1110 and/or the device driver 1120 may be implemented by hardware, software and/or firmware. The application 1110 may refer to one or more application programs executed by the host controller 1130 at the host 1100.

The device driver 1120 operates or controls devices attached to the host 1100 by providing a software interface to hardware devices, enabling operating systems and other host programs to access hardware functions without knowledge of precise details of the hardware being used.

The buffer memory 1140 may be used as a main memory and/or a cache memory of the host 1100. The buffer memory 1140 (e.g., synchronous random access memory (SRAM) and/or dynamic random access memory (DRAM)) may also be used as a driving memory to drive software such as the application 1110 and/or the device driver 1120.

Still referring to FIG. 1, as mentioned above, the storage device 1200 includes: a non-volatile memory (or memory device) 1210; a memory controller (also referred to as a device controller) 1230; and a buffer memory 1240. In this example, the storage device 1200 may be a data storage device based on a non-volatile memory, such as a solid state drive (SSD), a flash memory, a magnetic random access memory (MRAM), phase-change memory (PCM), a ferroelectric RAM (FeRAM), dynamic random access memory (DRAM), a resistive random-access memory (ReRAM), etc.

In one example, the non-volatile memory may be a two-dimensional (2D) or three dimensional (3D) memory array. A 3D memory array is monolithically formed in physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

The 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Patent Application Publication No. 2011/0233648.

The memory controller 1230 controls an overall operation of the non-volatile memory 1210 including, for example, write operations, read operations, erase operations, maintenance operations (including, e.g., a read for copy-back operation, garbage collection), encoding/decoding, error correction, etc. The memory controller 1230 exchanges data, address information and/or error location information with the non-volatile memory 1210 and/or the buffer memory 1240 through an address and/or data bus.

Still referring to FIG. 1, the buffer memory 1240 temporarily stores data to be stored in the non-volatile memory 1210 and/or data read from the non-volatile memory 1210. The buffer memory 1240 may be implemented by a volatile and/or non-volatile memory (e.g., synchronous random access memory (SRAM) and/or dynamic random access memory (DRAM)).

A more detailed discussion of the memory controller 1230, the buffer memory 1240 and the non-volatile memory 1210, including additional functionality of these components, will be provided later with regard to FIGS. 2 through 5.

Figure 2:
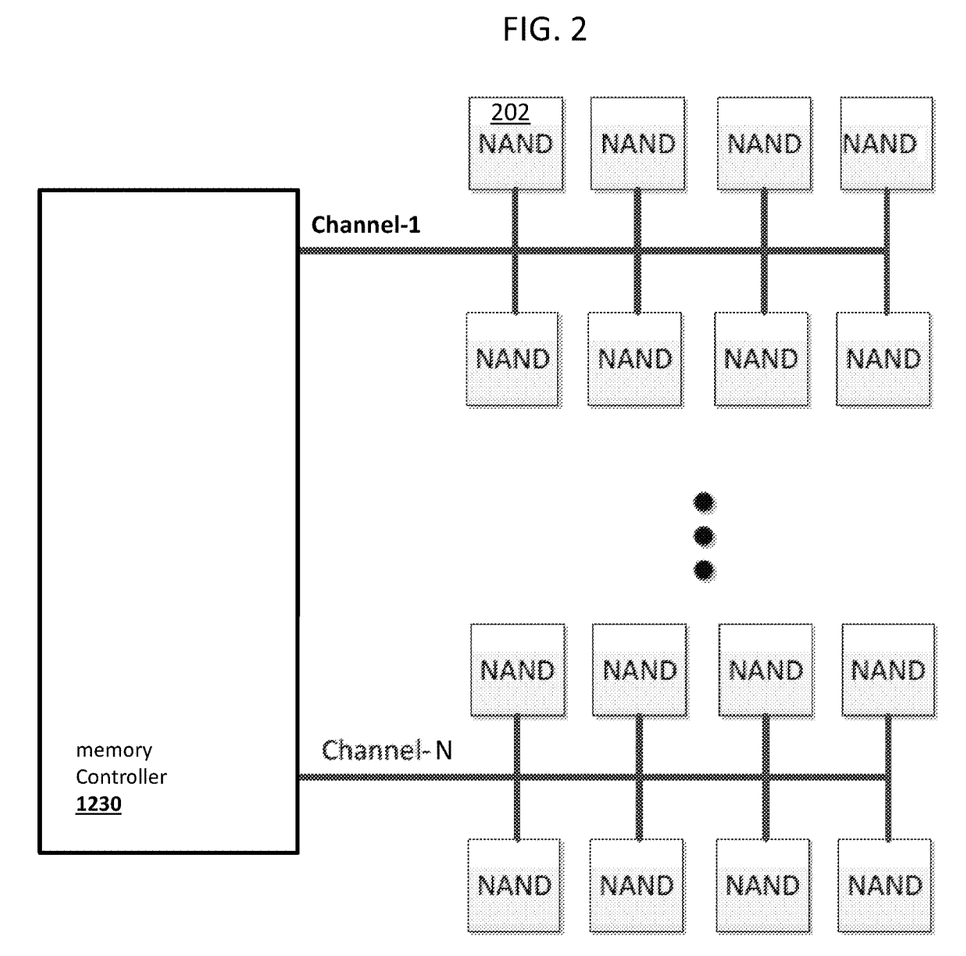
FIG. 2 illustrates an exemplary embodiment of a portion of the storage device shown in FIG. 1 in more detail.
Figure 3:
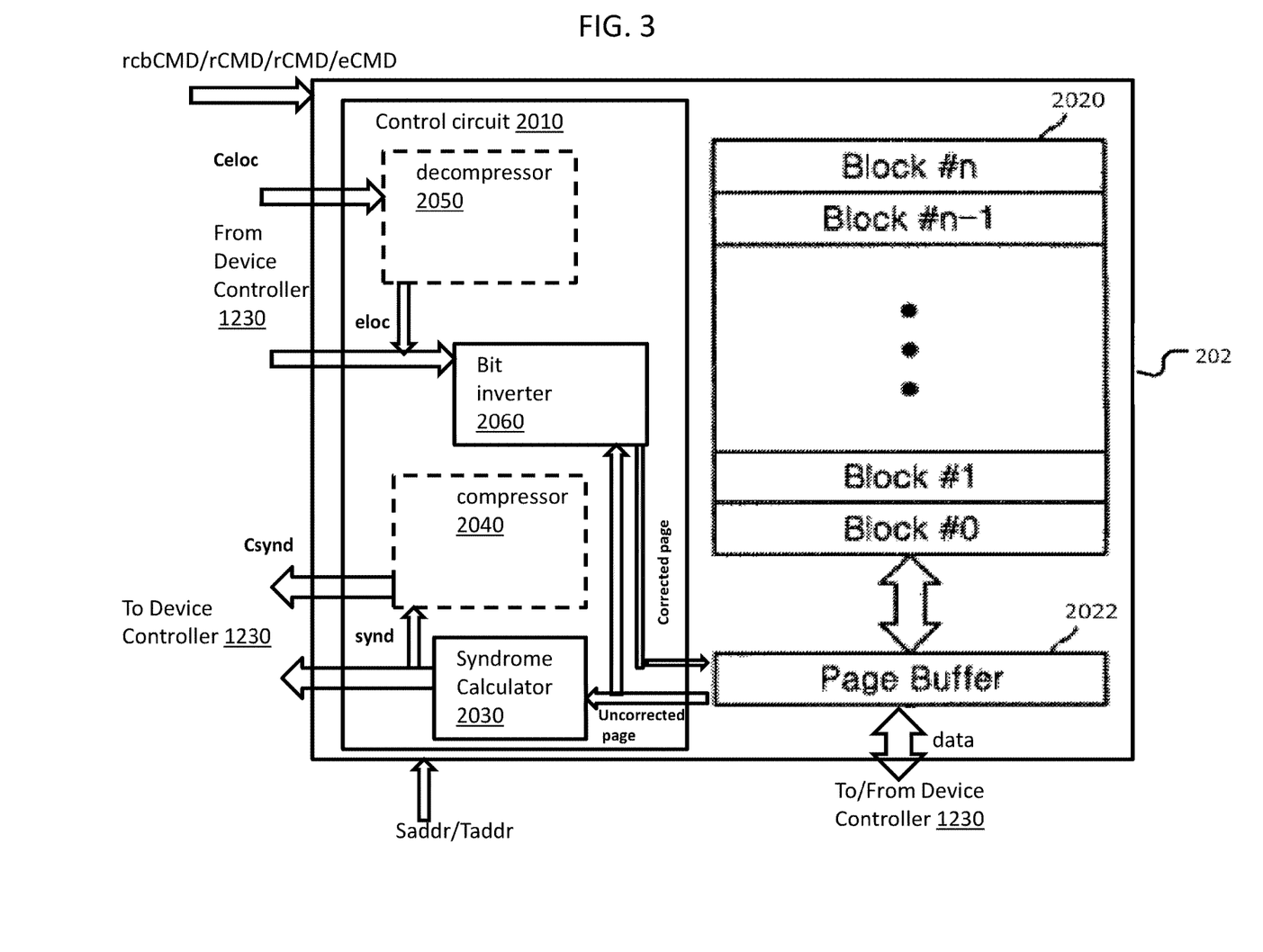
FIG. 3 illustrates an example embodiment of a NAND of FIG. 2 in more detail.
Figure 4:
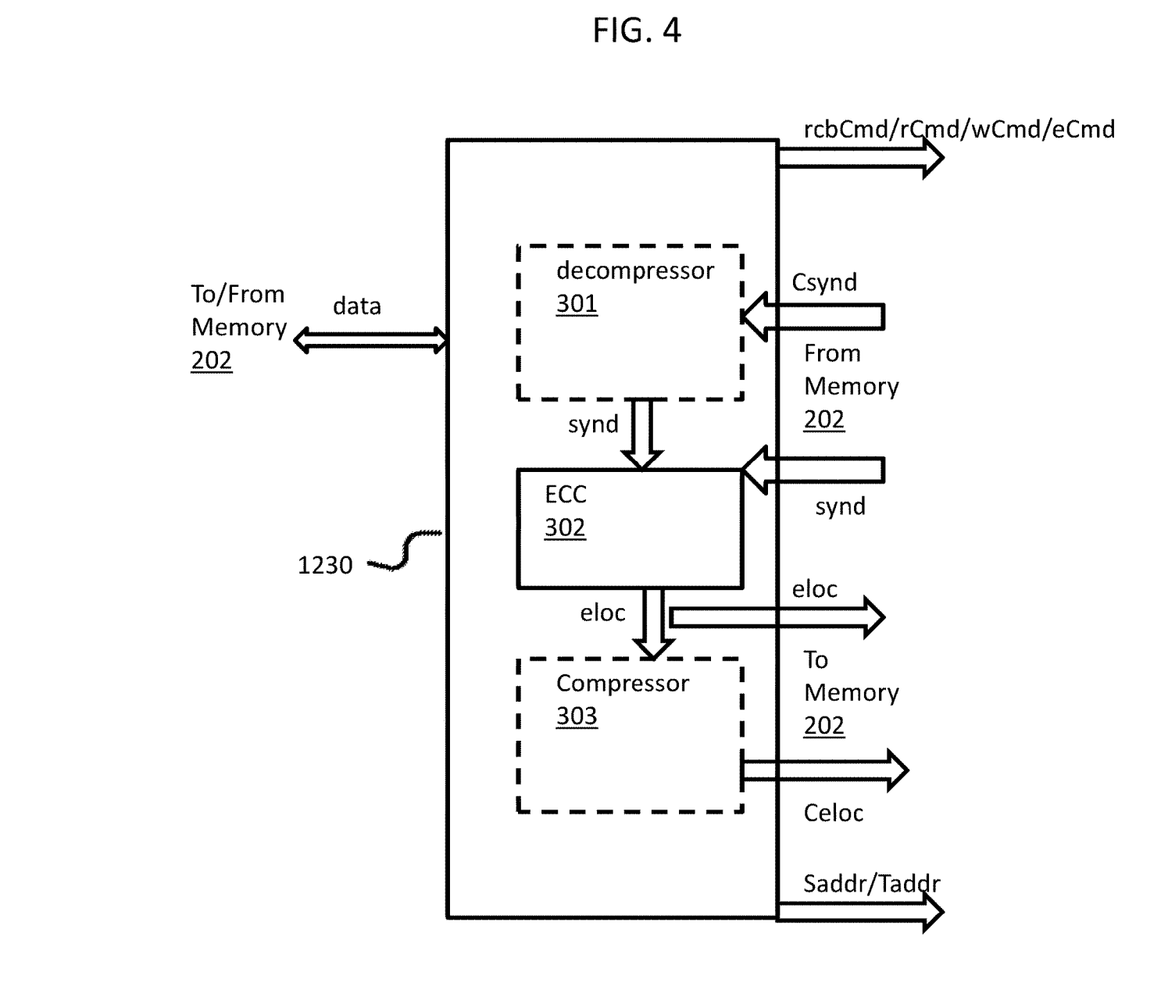
FIG. 4 illustrates an embodiment of a memory controller of FIG. 2 in more detail.

FIG. 2 illustrates an example embodiment of a portion of the storage device shown in FIG. 1 in more detail. FIG. 3 illustrates an example embodiment of a memory of FIG. 2 in more detail. FIG. 4 illustrates an example embodiment of a memory controller of FIG. 2 in more detail.

Referring to FIG. 2, the non-volatile memory 1210 includes a plurality of sets of NAND devices (also referred to as non-volatile memory devices). Each NAND device may be, or include, one or more NAND chips or NAND dies.

Each set of NAND devices is connected to one of a plurality of NAND channels (also referred to as memory channels) Channel-1, . . . , Channel-N, where N is 1 or more. While FIG. 2 shows each channel including 8 NAND devices, the inventive concept is not limited thereto. For example, each channel may have less than 8 NAND devices or more than 8 NAND devices. Further, in alternate embodiments, the NAND devices may be replaced with NOR devices.

Referring to FIG. 3, the NAND device 202 includes: a memory cell array 2020; a page buffer 2022; a bit inverter 2060 (e.g., inverting circuit), and a syndrome calculator 230 (e.g., logic circuit). The memory cell array 2020 includes a plurality of memory blocks Block#0, Block#1, . . . Block#i, . . . , Block#n−1, and Block#n. Each of the memory blocks Block#0 through Block#n includes a plurality of memory cells. Data is stored in each of the memory blocks Block#0 through Block#n in pages, and each of the memory blocks Block#0 through Block#n may store a plurality of pages of data. The NAND device 202 may additionally include a compressor 2040 (e.g., a logic circuit) and a decompressor 2050 when data compression is used. The NAND 202 may includes include a command decoder for decoding commands received from the memory controller 1230 and an address decoder for decoding addresses received from the memory controller 1230. In an embodiment, the syndrome calculator 2030 and the bit inverter 2060 form a control circuit 2010 of the memory (e.g., 202). At least one of the command decoder, the address decoder, the compressor 2040, and the decompressor 2050 may be included in the control circuit.

The page buffer 2022 can output a page of program data to one of the memory blocks Block#0 through Block#n to program the page data to a page of the memory block. When page data is read from a memory block of the memory cell array 2020, the read page data may be temporarily buffered in the page buffer 2022 and then output to, for example, the memory controller 1230.

An example operation of the memory controller 1230 and the non-volatile memory 1210 during an example embodiment of a read for copy-back operation will be discussed in more detail below with regard to FIGS. 3-5.

For example purposes, a case in which valid page data in an i-th source memory block among Block#0 through Block#n in the NAND device (also referred to as a source NAND device) 202 is copied to a j-th other memory block in the NAND device 202 (also referred to as a target NAND device) will be described. If the target memory block requires erasing prior to copying the page data, the erase operation may be performed independently using any suitable well-known algorithm. Although example embodiments will be described with regard to the NAND device 202 shown in FIGS. 2 and 3, the same or substantially the same operations may be performed for each NAND device.

Figure 5:
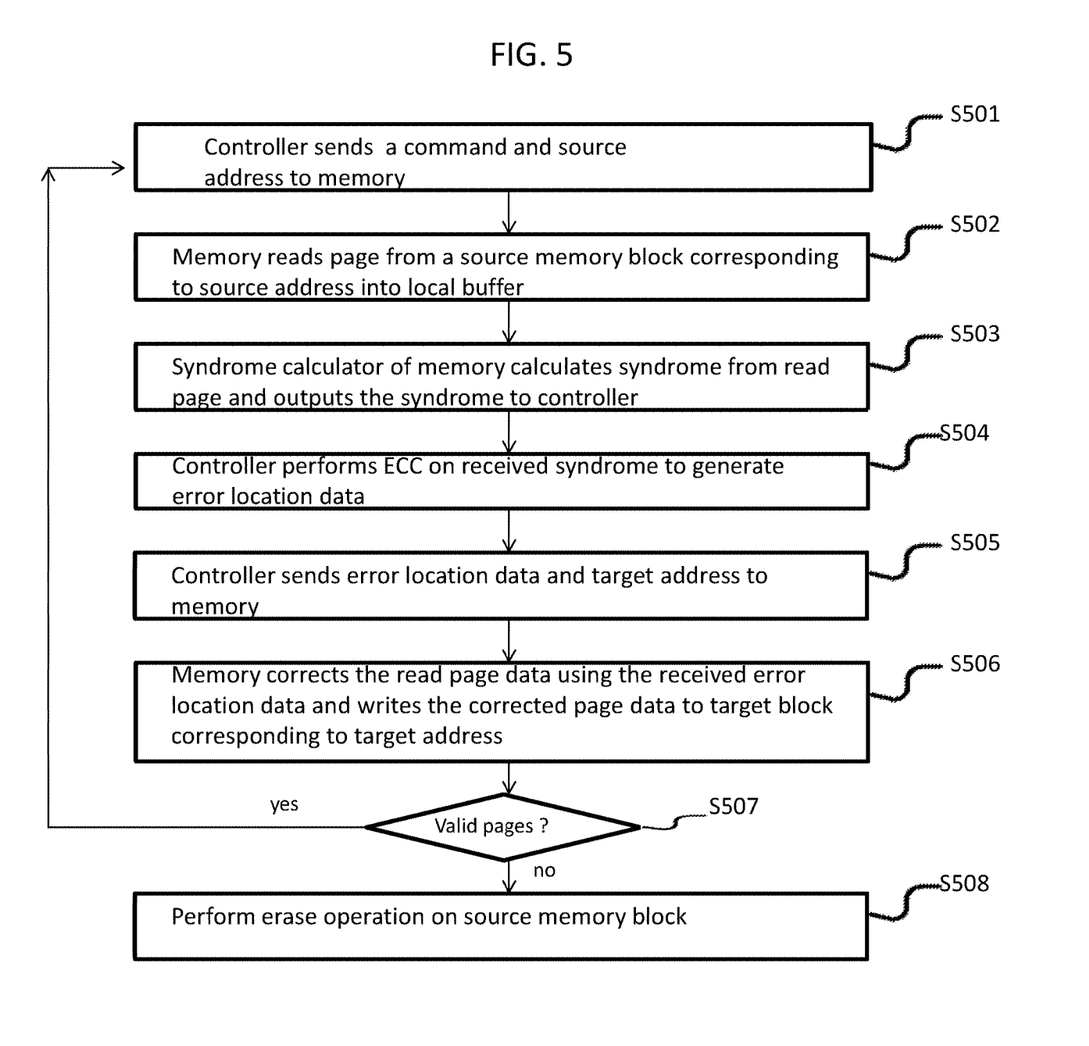
FIG. 5 illustrates a method of performing a read for copy-back operation according to an exemplary embodiment of the inventive concept.

FIG. 5 is a flow chart illustrating an example embodiment of a read for copy-back operation. The method shown in FIG. 5 will be described with regard to the memory controller 1230 and the non-volatile memory 1210 shown in FIGS. 2-4.

In step S501, the memory controller 1230 sends a command and a corresponding source address to the memory. In an embodiment, the command (e.g., read for copy-back command rcbCMD in FIG. 4) differs from a standard read command (e.g., rCMD) so that the memory (e.g., NAND device 202) understands that it needs to perform operations in addition to a read, wait for additional information, and perform operations using the additional information and the read data. The memory controller 1230 may also send other commands to the memory such as a read command rCMD for reading one or more pages, a write command wCMD for writing one or more pages, and an erase command eCMD for erasing a memory block. For example, the memory controller 1230 may send the erase command eCMD to easing a memory block after determining that the memory block does not include any valid pages.

In step 502, the memory (e.g., NAND device 202) reads valid page data from a source memory block corresponding to the source address into a local buffer (e.g., page buffer 2022). For example, the source address could indicate that the third page of block #0 is to be read. The command may be used to read out the valid page data while a chip enable signal is applied to the NAND device 202 to enable the NAND device 202.

In step 503, a syndrome calculator (e.g., 2030) of the memory calculates a syndrome synd from the read page data and outputs the syndrome to the device controller (e.g., 1230). In an exemplary embodiment, the syndrome is binary data that is calculated by multiplying the binary read data vector with a parity-check matrix. The size of the syndrome is significantly smaller than the read data vector (e.g., 10%). In an embodiment, the syndrome calculator 203 is implemented by a logic circuit or a processor. For example, since the NAND device 202 is connected to Channel-1, the NAND device 202 outputs the syndrome synd across Channel-1 to the controller 1230. The calculation of the syndrome synd occurs in response to receiving the read for copy-back command rcbCMD. Had a read command rCMD instead been received, the read page data would not have been output to the syndrome calculator 2030, but would have been sent to the device controller 1230.

In an alternate embodiment of the inventive concept, the memory (e.g., NAND device 202) compresses the syndrome synd to generate a compressed syndrome Csynd for output to the device controller (e.g., 1230). For example, the memory optionally includes a compressor 2040 to compress the syndrome synd. In an embodiment, the compressor 2040 is implemented using a logic circuit or a processor.

In step 504, the controller (e.g., 1230) performs an error correction coding (ECC) operation on the received syndrome synd to generate error location data eloc. In an embodiment, an ECC unit 302 (e.g., a correction circuit or logic circuit) of the controller performs the ECC operation. For example, if the pages are each 64 bits, then the error location data eloc could indicate that bits 1 and 30 have errors. When the received syndrome synd is compressed (e.g., Csynd), the device controller 1230 additionally includes a decompressor 301 to decompress the compressed syndrome Csynd into the syndrome synd. In an embodiment, the decompressor 301 is implemented by a logic circuit or a processor.

In step 505, the device controller (e.g., 1230) sends the error location data and a target address Taddr to the memory (e.g., NAND device 202). In an alternate exemplary embodiment, the device controller (e.g., 1230) compresses the error location data eloc before sending it to the memory (e.g., NAND device 202). In this embodiment, the device controller 1230 additionally includes a compressor 303 for compressing the error location data eloc into compressed error location data Celoc. In an embodiment, the compressor 303 is implemented by a logic circuit or a processor. In an embodiment, the target address Taddr indicates the location of a target memory block within the same NAND device 202 (e.g., Block #1). In an alternate embodiment, the target address Taddr is not sent with the error location data (e.g., eloc/Celoc), but with the read for copy-back command rcbCMD and the source address in step S501. In an embodiment, the compressed error location data Celoc is temporally stored in the buffer memory 1240, and then the buffer memory 1240 outputs the compressed error location data to the non-volatile memory 1240.

In step S506, the memory (e.g., NAND device 202) corrects the read page data using the received error location data and writes the corrected page data to a target memory block corresponding to the target address Taddr. When the received error location data is compressed, the memory (e.g., NAND device 202) further includes a decompressor 2050 that decompresses the compressed error location data Celoc into the error location data eloc. In an embodiment, the bit inverter 2060 (e.g., a logic circuit) or other logic of the memory (e.g., NAND device 202) corrects the read page data by flipping (inverting) bits of the read page data having locations references by the error location data eloc. The bit inverter 1060 may include a decoder that decodes the error location data to determine the locations of the bits having the errors. For example, if the error location data eloc indicates that bit 30 has an error, and bit 30 of the read page data is a 0, then the bit inverter 206 would invert bit 30 to a value of 1. In an embodiment, the page buffer 2022 simultaneously sends the read page data to both the syndrome calculator 2030 and the bit inverter 2060. In an embodiment, the bit inverter 2060 includes one or more inverters to invert bits of the read page data identified by the error location data eloc. The corrected page data is written to a page of the target memory block (e.g., block #1) identified by target address Taddr. In an embodiment, the target memory block is deleted before the corrected page data is written to the target memory block. In a preferred embodiment, the source memory block and the target memory block are located within a same NAND device (e.g., 202) to minimize the amount of traffic on the channels.

Once the corrected page data is written to the target memory block, the corresponding page of the source memory block can be invalidated. The storage device 1200 may keep track of all the valid and invalid pages using a table. For example, the NAND device (e.g., 202) could update an entry of the table to indicate that the corresponding page of the source memory block is invalid after writing the corrected page data to the target memory block. In an alternate embodiment, the device controller 1230 maintains the table. For example, the device controller 1230 could set the table to indicate that the page of the source memory block has been invalidated after its data has been copied to the destination memory block.

In step S507, the device controller (e.g., 1230) checks to determine whether there any valid pages left in the source memory block. For example, if all flags of the table associated with the source memory block are clear (i.e., none are set), the controller 1230 can conclude that no valid pages remain.

In step S508, the controller (1230) performs an erase operation on the source memory block upon determining it has no valid pages to free up space. The performing of the erase operation is optional. The performing of both the read for copy-back operation and the erase operation may be referred to as performing a garbage collection operation.

In alternate embodiment, the controller (e.g., 1230) checks for memory blocks without any valid pages periodically, independent of the read for copy-back command, and then performs an erase operation on any of those it concludes have no valid pages.

In the above embodiment, data transmission along the channels may be reduced by as much as 92%. For example, rather than transmitting the entire page from the NAND device 202 to the device controller 1230, the NAND device 202 only outputs the syndrome synd. For example, this reduction may occur when the syndrome syn is 10% the size of the page it is generated from, and the compressed error location data Celoc is 5% the size of the page. In an exemplary embodiment, the compressor 303 that generates the compressed error location data uses a compression algorithm that achieves entropy with low complexity and low latency. Further, the NAND device 202 may have reduced area since rather than locate an entire ECC unit within the NAND, only the bit inverter 2060 need be included. Further, the device controller 1230 may have a reduced size since its ECC unit 302 need not include a syndrome calculator.

In an exemplary embodiment, a garbage collection processor is performed by performing several of the read for copy-back operations discussed above so that all valid pages in a first block ((e.g., see block #0 in FIG. 3)) of memory are read to a controller (e.g., memory controller 1230). The controller may then perform an error correction operation on the read pages to generate corrected pages, and send the corrected pages to the memory (e.g., 1210), so they can be written to a second other block in the memory (e.g., a second other block in the same NAND, a different NAND connected to a same channel, or a different NAND connected to a different channel). The first block can then be erased to free up space in the memory. For example, the controller can send an erase command and an address identifying the first block to the memory so the memory can delete the first block in response to receiving the erase command and the address.

The storage devices described above to perform the above-described read for copy-back operations may be implemented by various memory devices such as flash memory, magnetic random access memory (MRAM), phase-change memory (PCM), ferroelectric RAM (Fe-RAM), dynamic random access memory (DRAM), a resistive random-access memory (ReRAM), etc.

Figure 6:
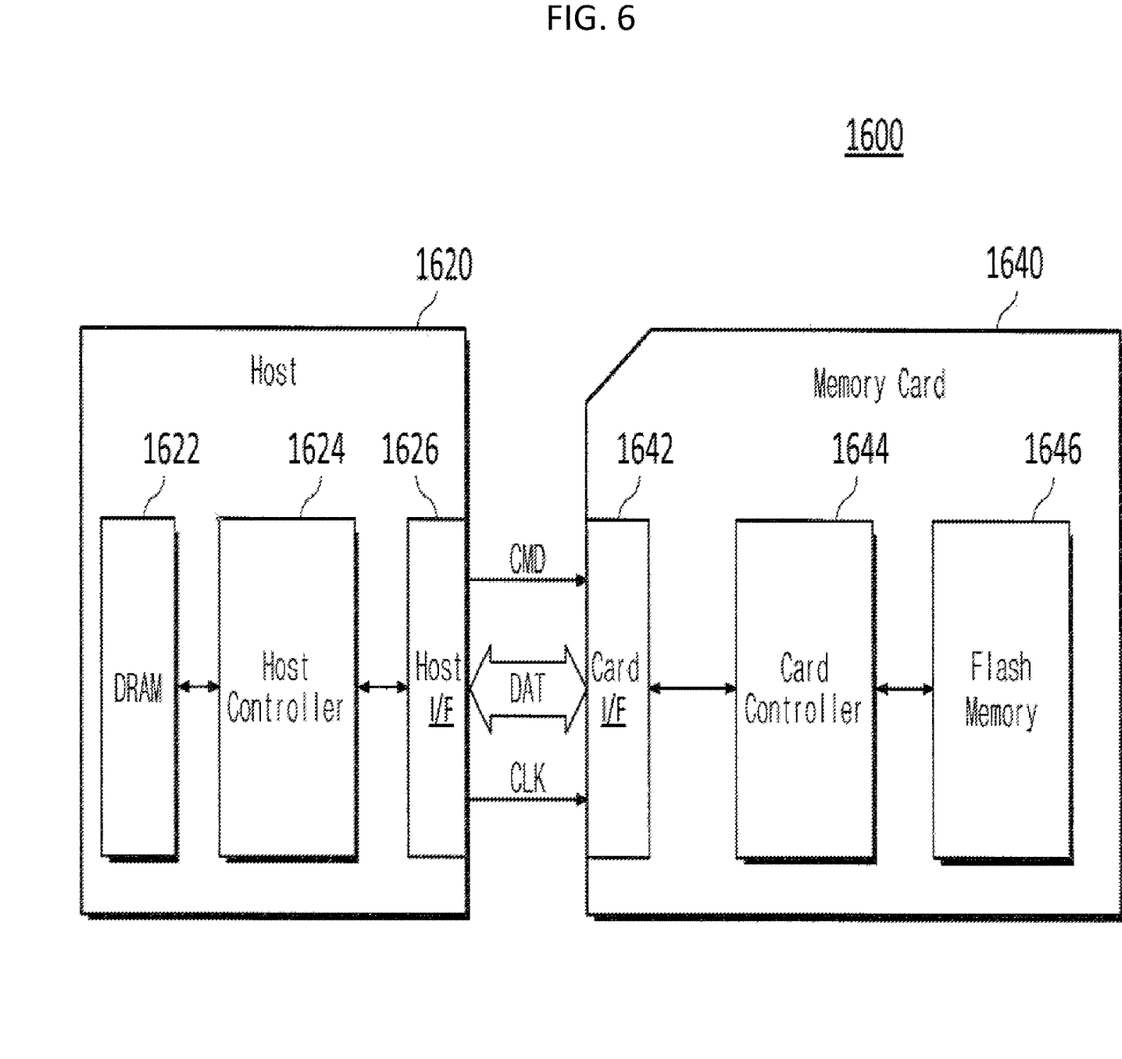
FIG. 6 illustrates a memory card system including a storage device according to an example embodiment.

FIG. 6 is a block diagram illustrating a memory card system including a storage device according to an example embodiment.

Referring to FIG. 6, a memory card system 1600 includes a host 1620 and a memory card 1640. The host 1620 includes a host controller 1624, a host interface 1626, and a DRAM 1622.

The host 1620 writes data to the memory card 1640 and/or reads data from the memory card 1640. The host controller 1624 sends a command CMD (e.g., a write command), a clock signal CLK generated from a clock generator (not shown) in the host 1620, and data DAT to the memory card 1640 via the host interface 1626. The DRAM 1622 may be a main memory of the host 1620.

The memory card 1640 includes a card interface 1642, a card controller 1644, and a flash memory 1646. The card controller 1644 stores data at the flash memory 1646 in response to a command input via the card interface 1642. The data may be stored in synchronization with the clock signal CLK generated from the clock generator (not shown) in the card controller 1644. The flash memory 1646 stores data transferred from the host 1620. The flash memory 1646 may operate in accordance with example embodiments discussed above with regard to FIGS. 2A through 5 to perform more efficient read for copy-back operations. The card controller 1644 may include, or be implemented as, the device controller 1230 discussed above with regard to FIGS. 2 through 5. Accordingly, the memory card 1644 may operate in accordance with example embodiments to perform more efficient read for copy-back operations.

Figure 7:
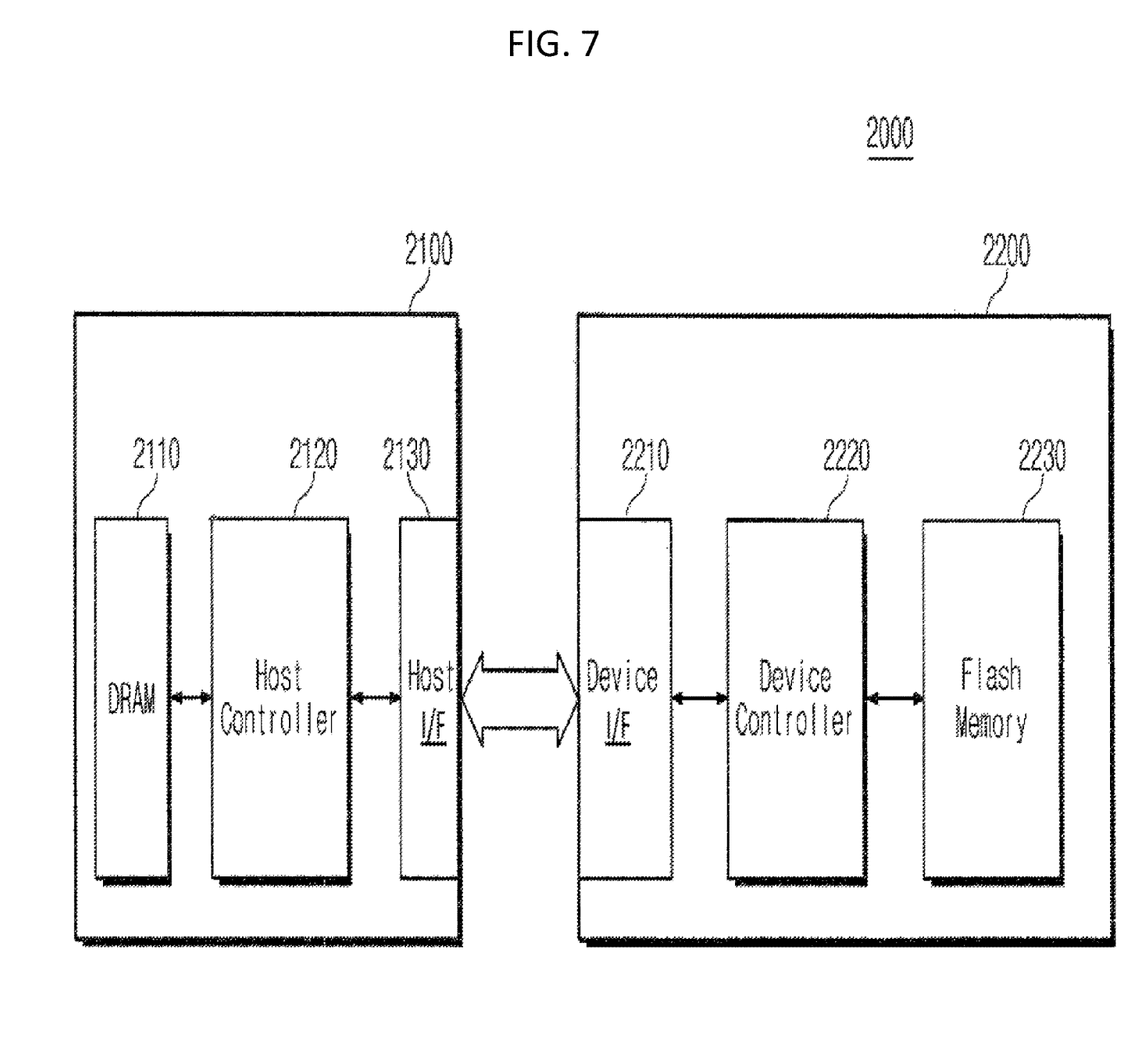
FIG. 7 illustrates a Universal Flash Storage (UFS) system in which a storage device according to an example embodiment may be implemented.

FIG. 7 is a block diagram illustrating a Universal Flash Storage (UFS) system in which a non-volatile memory device according to an example embodiment may be implemented.

Referring to FIG. 7, a UFS system 2000 includes a UFS host 2100 and a UFS device 2200. The UFS host 2100 includes a host controller 2120, a host interface 2130, and a DRAM 2110.

The UFS host 2100 writes data in the UFS device 2200 and/or reads data from the UFS device 2200. The DRAM 2110 may be a main memory of the UFS host 2100. The UFS host 2100 communicates with the UFS device 2200 via the host interface 2130 and a device interface 2210 of the UFS device 2200.

The UFS device 2200 includes the device interface 2210, a device controller 2220, and a flash memory 2230. The device controller 2220 stores data at the flash memory 2230 in response to a command input via the device interface 2210. The flash memory 2230 stores data transferred from the UFS host 2100.

The UFS device 2200 may operate in accordance with example embodiments to perform more efficient read for copy-back operations.

Figure 8:
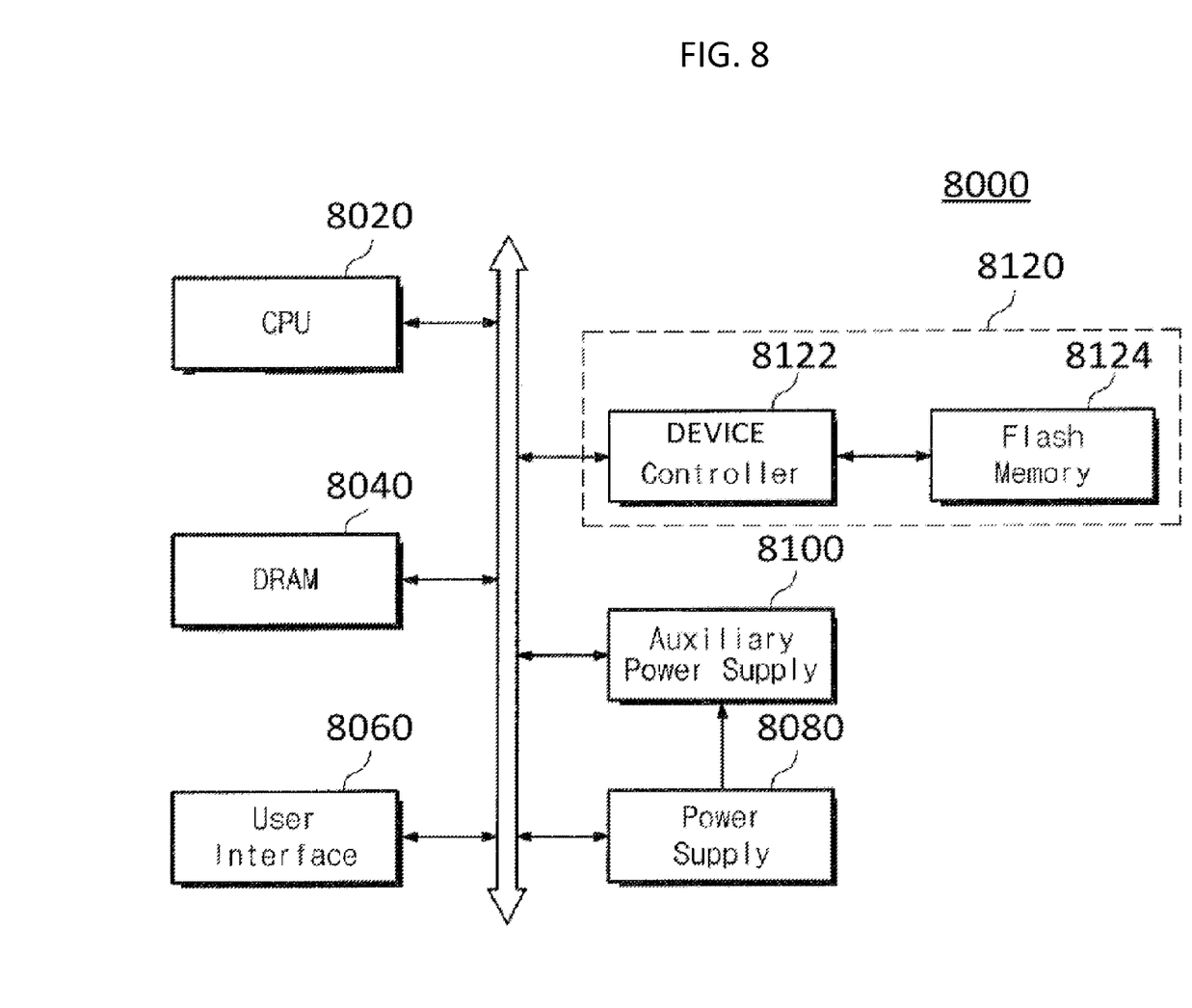
FIG. 8 illustrates an electronic device in which a storage device according to an example embodiment may be implemented.

FIG. 8 is a block diagram illustrating an electronic device including a memory device according to an example embodiment. Herein, an electronic device may be a personal computer or a handheld electronic device such as a notebook computer, a cellular phone, a personal digital assistant (PDA), a camera, or the like.

Referring to FIG. 8, the electronic device 8000 includes: a memory device 8120; a power supply device 8080; an auxiliary power supply 8100; a CPU 8020; a DRAM 8040; and a user interface 8060. The memory device 8120 includes a flash memory 8124 and a device controller 8122. The memory device 8120 may be built in the electronic device 8000.

The memory device 8120 may operate in accordance with example embodiments to perform more efficient read for copy-back operations.

Figure 9:
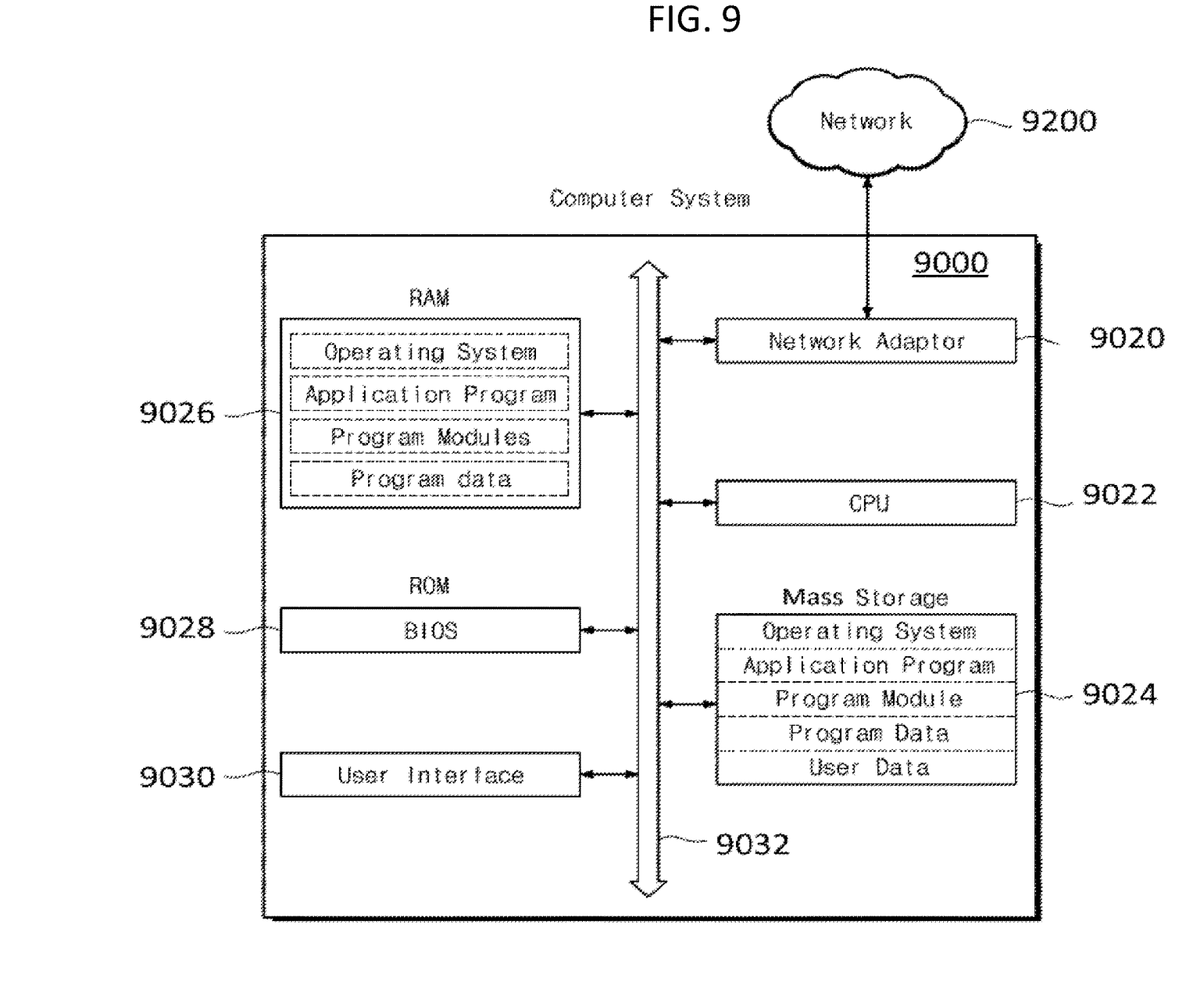
FIG. 9 illustrates a computing system including a storage system according to an example embodiment.

FIG. 9 is a block diagram schematically illustrating a computing system including a storage device according to an example embodiment.

Referring to FIG. 9, a computing system 9000 includes: a network adaptor 9020; a central processing unit (CPU) 9022; a mass storage device 9024; a RAM 9026; a ROM 9028; and a user interface 9030. The components of the computing system 9000 are connected by a system bus 9032.

The network adaptor 9020 provides an interface between the computing system 9000 and external networks 9200. The CPU 9022 controls an overall operation for driving an operating system and an application program which are resident on the RAM 9026. The mass storage device 9024 stores data needed for the computing system 9000. For example, the mass storage device 9024 may store an operating system for driving the computing system 9000, an application program, various program modules, program data, user data, etc.

The RAM 9026 is used as a working memory of the computing system 9000. Upon booting, the operating system, the application program, the various program modules, and program data needed to drive programs and various program modules read out from the mass storage device 9024 may be loaded into the RAM 9026. The ROM 9028 stores a basic input/output system (BIOS), which is activated before the operating system is driven upon booting. Information exchange between the computing system 9000 and a user may be made via the user interface 9030.

In addition, the computing system 9000 may further include a battery, a modem, and the like. Although not shown, the computing system 9000 may further include an application chipset, a camera image processor (CIS), a mobile DRAM, and the like.

The mass storage device 9024 may operate in accordance with example embodiments to perform more efficient read for copy-back operations.

According to one or more example embodiments, the mass storage device 9024 may be implemented by a solid state drive, a multimedia card (MMC), a secure digital (SD) card, a micro SD card, a memory stick, an ID card, a PCMCIA card, a chip card, an USB card, a smart card, a compact flash (CF) card, etc.

Figure 10:
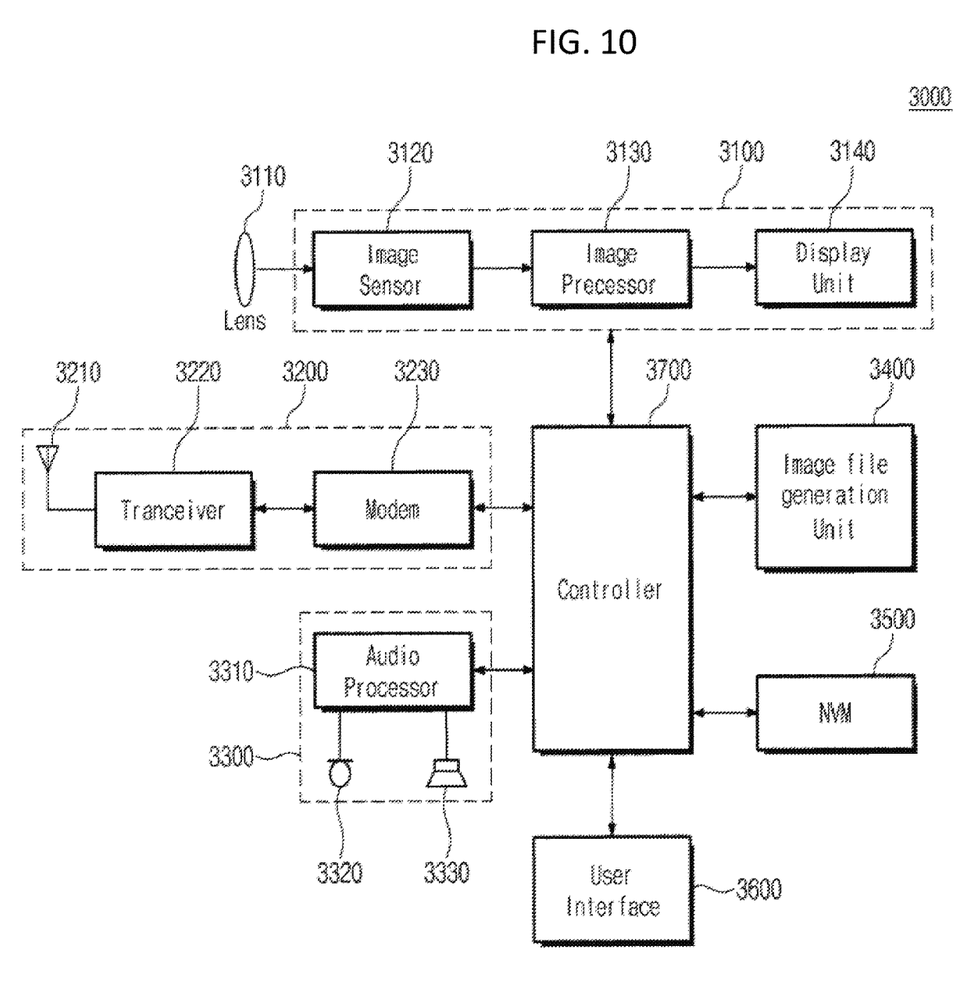
FIG. 10 illustrates a handheld terminal including a storage device according to an example embodiment.

FIG. 10 is a block diagram schematically illustrating a handheld terminal according to an example embodiment.

Referring to FIG. 10, a handheld terminal 3000 includes: an image processing circuit 3100; a wireless transceiver circuit 3200; an audio processing circuit 3300; an image file generating circuit 3400; a non-volatile memory device 3500; a user interface 3600; and a controller 3700.

The image processing circuit 3100 includes: a lens 3110; an image sensor 3120; an image processor 3130; and a display unit 3140. The wireless transceiver circuit 3200 includes: an antenna 3210; a transceiver 3220; and a modem 3230. The audio processing circuit 3300 includes: an audio processor 3310; a microphone 3320; and a speaker 3330.

The non-volatile memory device 3500 may operate in accordance with example embodiments to perform more efficient read for copy-back operations. The non-volatile memory device 3500 shown in FIG. 10 may be one of a memory system, a memory card, an SSD, an eMMC, etc.

Nonvolatile memory devices and/or memory controllers according to example embodiments of inventive concepts may be packed by according to various types of packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Although the present inventive concept has been described in connection with exemplary embodiments thereof, those skilled in the art will appreciate that various modifications can be made to these embodiments without substantially departing from the principles of the present inventive concept.

What is claimed is:

1. A storage device comprising:
a nonvolatile memory (NVM) device comprising a plurality of memory blocks and a control circuit configured to perform a read for copy-back operation in response to a receipt of a corresponding command from a memory controller located outside the NVM device,
wherein the control circuit performs the read for copy-back operation by reading page data from a source memory block of the plurality of memory blocks, generating a syndrome from the read page data, outputting the syndrome to the memory controller, receiving error location data from the memory controller in response to outputting the syndrome, correcting the read page data using the received error location data, and writing the corrected read page data to a target memory block among the plurality of memory blocks,
wherein the control circuit compresses the syndrome.

2. The storage device of claim 1, wherein the NVM device is one of a plurality of NAND devices connected to a channel, the channel is additionally connected to the memory controller, the source memory block is a first one of the memory blocks of one of the NAND devices and the target memory block is a second one of the memory blocks of the same one NAND device.

3. The storage device of claim 1, wherein the control circuit corrects the read page data by inverting bits of the read page data referenced in the error location data.

4. The storage device of claim 1, wherein the memory controller sends a source address and a target address to the memory controller, the control circuit reads the page data from the source memory block identified by the source address, and the control circuit writes the corrected page data to the target memory block identified by the target address.

5. The storage device of claim 1, wherein the memory controller performs an error correction coding operation on the syndrome to generate the error location data.

6. The storage device of claim 1, wherein the memory controller compresses the error location data before outputting it to the control circuit.

7. The storage device of claim 6, wherein the control circuit decompresses the compressed error location data and corrects the read page data using the decompressed error location data.

8. The storage device of claim 1, wherein the memory controller decompresses the compressed syndrome and performs an error correction coding operation on the decompressed syndrome to generate the error location data.

9. The storage device of claim 1, wherein the control circuit performs an erase operation on the source memory block after performing the read for copy-back operation.

10. A method of performing read for copy-back comprising:
reading, by a control circuit of a storage device, page data from a source memory block of a nonvolatile memory (NVM) device in response to a command from a memory controller located outside the NVM device;
generating, by the control circuit, a syndrome from the read page data;
outputting, by the control circuit, the syndrome to the memory controller;

receiving, by the control circuit, error location data from the memory controller in response to outputting the syndrome;

correcting, by the control circuit, the page data using the received error location data; and writing, by the control circuit, the corrected page data to a target memory block of the NVM device, wherein the control circuit compresses the syndrome.

11. The method of claim 10, wherein the NVM device is one of a plurality of NAND devices connected to a channel, the channel is additionally connected to a memory controller, the source memory block is a first one of the memory blocks of one of the NAND devices and the target memory block is a second one of the memory blocks of the same one NAND device.

12. The method of claim 10, wherein the correcting comprises inverting bits of the read page data referenced in the error location data.

13. The method of claim 10, wherein the syndrome is compressed before it is output.

14. The method of claim 11, further comprising:

performing, by the memory controller, an error correction coding operation on the syndrome to generate the error location data; and outputting, by the memory controller, the error location data across the channel to the control circuit.

15. The method of claim 14, wherein the error location data is compressed by the memory controller before it is output.

16. A storage device comprising:

a nonvolatile memory (NVM) device comprising a plurality of memory blocks;

a memory controller configured to output a first command to the NVM device for performing a read for copy-back operation on a source memory block of the plurality of memory blocks to copy page data of the source memory block to a target memory block of the plurality of memory blocks, wherein the memory controller is configured to receive a syndrome from the NVM device in response to outputting the command, perform an error correction coding on the syndrome to generate error location data, and output the error location data to the NVM device, wherein a control circuit of the storage device compresses the syndrome.

17. The storage device of claim 16, wherein the memory controller is configured to output a second command to the memory controller for erasing the source memory block after outputting the first command and determining the source memory block has no valid pages.

18. The storage device of claim 16, wherein the NVM device performs the read for copy-back operation by reading the page data from the source memory block, generating the syndrome from the read page data, outputting the syndrome to the memory controller, correcting the read page data using the received error location data, and writing the corrected page data to the target memory block.

* * * * *